US005414363A

United States Patent [19]

Charmoille et al.

[11] Patent Number: 5,414,363

[45] Date of Patent: May 9, 1995

[54] METHOD FOR THE ELECTRICAL TESTING OF EQUIPOTENTIAL LINES

[75] Inventors: Gilles Charmoille, Guyancourt; Didier Desprin, Chatillon, both of France

[73] Assignee: Thomson-CSF, Paris, France

[21] Appl. No.: 206,095

[22] Filed: Mar. 2, 1994

[30] Foreign Application Priority Data

Mar. 12, 1993 [FR] France ................................ 93 02866

[51] Int. Cl.[6] ............................................ G01R 31/00

[52] U.S. Cl. ..................................... 324/537; 324/500

[58] Field of Search ............... 324/500, 537, 538, 133, 324/73.1

[56] References Cited

U.S. PATENT DOCUMENTS

| | | | |
|---|---|---|---|
| 3,763,430 | 10/1973 | Terrey | 324/500 |
| 4,091,325 | 5/1978 | Marcus et al. | 324/537 X |
| 5,045,783 | 9/1991 | Brunner et al. | 324/538 X |
| 5,124,633 | 6/1992 | Whitehead et al. | 324/73.1 |

FOREIGN PATENT DOCUMENTS

| | | |
|---|---|---|
| 0008954 | 3/1980 | European Pat. Off. . |
| 0147245 | 7/1985 | France . |
| 0490728 | 6/1992 | France . |
| 1947569 | 4/1970 | Germany . |
| 8900296 | 1/1989 | WIPO . |

OTHER PUBLICATIONS

IBM, Technical Disclosure Bulletin, vol. 32, No. 6A, Nov., 1989, pp. 301–309.

*Primary Examiner*—Kenneth A. Wieder
*Assistant Examiner*—Glenn W. Brown
*Attorney, Agent, or Firm*—Roland Plottel

[57] ABSTRACT

In a method for the electrical testing of equipotential lines, each line containing at least two testing points wherein, at least one cut-off line separates the testing points. The testing points of a first side of the cut-off line are grouped together in a first set and the testing points of the other side are grouped together in a second set, the testing points of the cut-off line belonging to both sets. The electrical test is carried out, in a first step, between the testing points of the first set and, in a second step, between the testing points of the second set, testing points of the first set being grouped in the second set while, in the same time, remaining in the first set, to ensure the continuity of the electrical testing between the testing points of the two sets. Application to tests on electrical continuity or insulation of electrical boxes notably.

7 Claims, 3 Drawing Sheets

J1
J2
J3
J4
J5
L1
L2
L3
L4
L5
L6
L7
Lc
1
2

J5
1
2
3
4
5
6
L4
L7
J4
L2
L3
J3
L1
L'c
J2
J1
L5
L6

METHOD FOR THE ELECTRICAL TESTING OF EQUIPOTENTIAL LINES

BACKGROUND OF THE INVENTION

The invention relates to a method for the electrical testing of equipotential lines. The invention can be applied notably to the testing of the electrical continuity or electrical insulation of wiring racks, card trays, electrical packages or printed circuits for example. More generally, it can be applied to the testing of all equipment for which it is necessary to check the electrical continuity or electrical insulation of the equipotential lines.

Items of electrical, electronic or data-processing equipment such as computers, for example, comprise a growing number of printed circuits as well as complex circuits that possess an ever-increasing number of inputs/outputs. This results in a growing number of equipotential lines connecting these inputs/outputs. Since the components or the cards are linked to other components or cards, these equipotential lines go through connectors connecting, for example, the cards to one another by means of tray bottoms or by case bottoms. These tray or case bottoms therefore have many connecting equipotential lines. A necessary condition for the efficient operation of the equipment is the electrical continuity of the equipotential lines that come into play, as well as the insulation between them.

There are instruments to test this continuity and this insulation. These instruments are connected to testing points generally located at the level of the connectors. These links are used for the successive testing of the sections of equipotential lines located between testing points.

Now, the above-mentioned tests on the electrical continuity and insulation of the above-mentioned items of equipment require a growing number of testing points, for example more than 8,000 testing points, in order to reach the maximum capacities of present-day testers. It is possible to increase the capacities of these testers, but this means paying the price of extra cost, complexity and a substantial amount of space occupied.

SUMMARY OF THE INVENTION

An aim of the invention is to avoid this drawback, notably by enabling the use of present-day testers to take account of a large number of testing points, for example a number whose magnitude is greater than the above-mentioned magnitude, hence to obtain this result without making these testers more complicated. To this end, an object of the invention is a method for the electrical testing of equipotential lines, each line containing by at least two testing points wherein, with at least one cut-off line separating the testing points, the testing points of a first side of the cut-off line being grouped together in a first set and the testing points of the other side being grouped together in a second set, the testing points of the cut-off line belonging to both sets, the electrical test is carried out, in a first step, between the testing points of the first set and, in a second step, between the testing points of the second set, testing points of the first set being grouped with the points of the second set while, in the same time, remaining in the first set, to ensure the continuity of the electrical testing between the testing points of the first set and the testing points of the second set.

The main advantages of the invention are that it is suited to testing the electrical continuity and electrical insulation of every type of electrical, electronic or data-processing equipment, is suited to every type of tester and is simple to implement and economical.

BRIEF DESCRIPTION OF THE DRAWINGS

Other features and advantages of the invention shall appear from the following description, made with reference to the appended drawings, of which.

DESCRIPTION OF THE INVENTION

Figure 1:
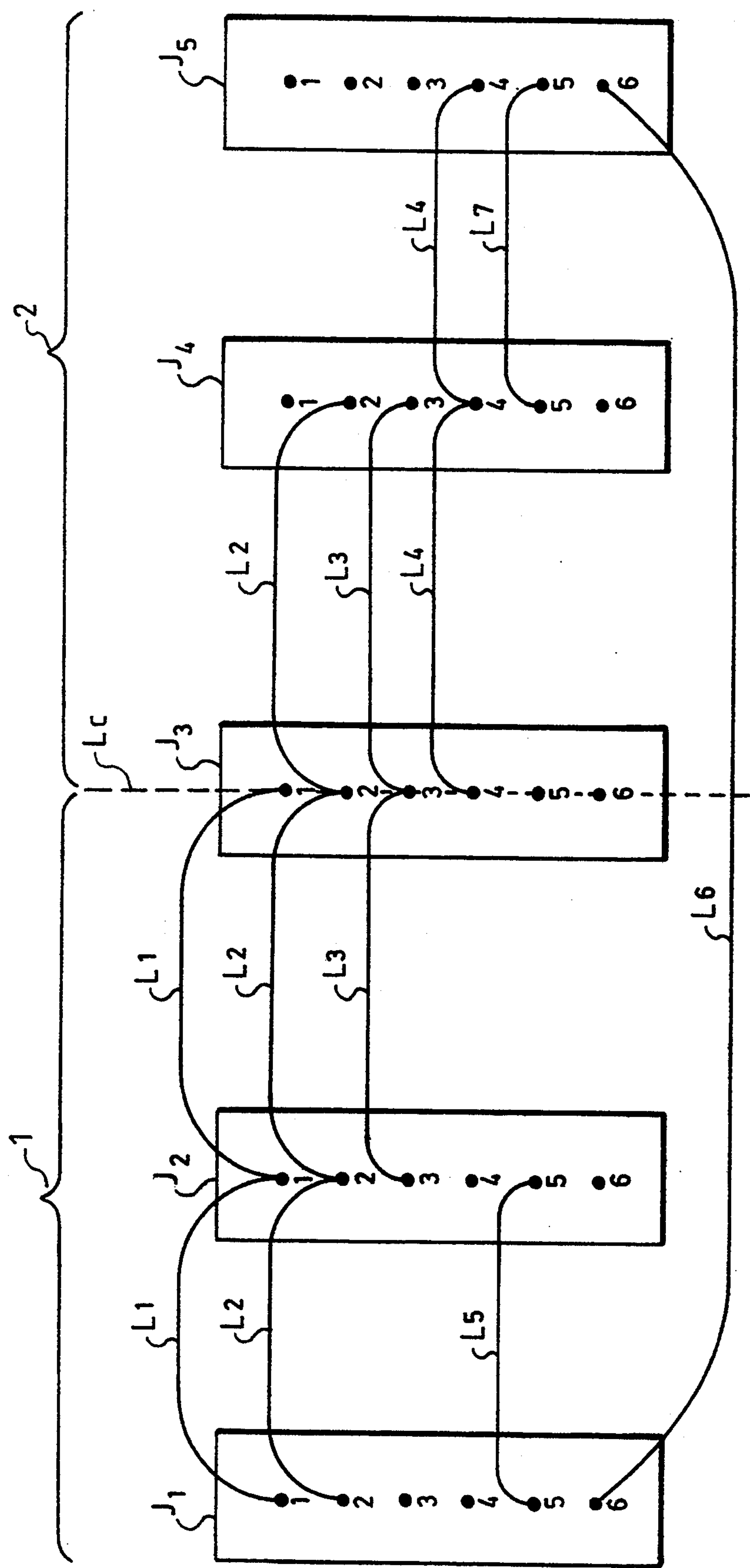
FIGS. 1, 2 and 3 show examples illustrating sets of electrical equipotential lines and testing points.

FIG. 1 shows an example illustrating a set of electrical equipotential lines L1, L2, L3, L4, L5, L6, L7. These lines go through connections J1, J2, J3, J4, J5 ordered according to a relationship depending, for example, on their relative positions. Each of the lines contains testing points. These testing points correspond, for example, to terminals of the connectors through which they pass, it being notably easier to carry out the tests at these positions. In this case, each testing point is identified, for example, by the order number of its connector and the order number of its corresponding terminal in the connector. In FIG. 1, an i order connector being referenced Ji, a testing point at a j order terminal inside this connector is, for example, referenced Ji/j. Thus, in the exemplary configuration of FIG. 1, a first equipotential line connects the first terminal J1/1 of a first connector J1 to the first terminal J3/1 of a third connector J3 in passing through the first terminal J2/1 of a second connector J2. A second line L2 line connects the second terminal J1/2 of the first connector J1 to the second terminal J4/2 of a fourth connector J4 in passing through the second terminal J2/2 of the second connector J2 and then through the second terminal J3/2 of the third connector J3. A third line L3 line connects the third terminal J2/3 of the second connector J2 to the third terminal J4/3 of the fourth connector J4 in passing through the third terminal J3/3 of the third connector J3. A fourth line L4 connects the fourth terminal J3/4 of the third connector J3 to the fourth terminal J5/4 of a fifth connector J5 in passing through the fourth terminal J4/4 of a fourth connector J4. A fifth line L5 connects the fifth terminal J1/5 of the first connector J1 to the fifth terminal J2/5 of the second connector J2. A sixth line L6 connects the sixth terminal J1/6 of the first connector J1 to the sixth terminal J5/6 of the fifth connector J5. A seventh line L7 connects the fifth terminal J4/5 of the fourth connector J4 to the fifth terminal J5/5 of the fifth connector J5.

The terminals of the connector belonging to equipotential lines correspond, for example, to testing points. A cut-off line Lc goes, for example, through the terminals of the third connector J3. The testing points located on a first side 1 of the cut-off line Lc, including for example points of the first connector J1, are grouped together in a first set E1. The testing points located on the other side 2 of the cut-off line Lc are grouped together in a second set E2, the testing points J3/1, J3/2, J3/3 of the cut-off line belonging to both sets E1, E2. A testing point J1/6, insulated on the first side 1 but connected to an equipotential line L6 overlapping the line is located solely in the second set E2.

Figure 2:
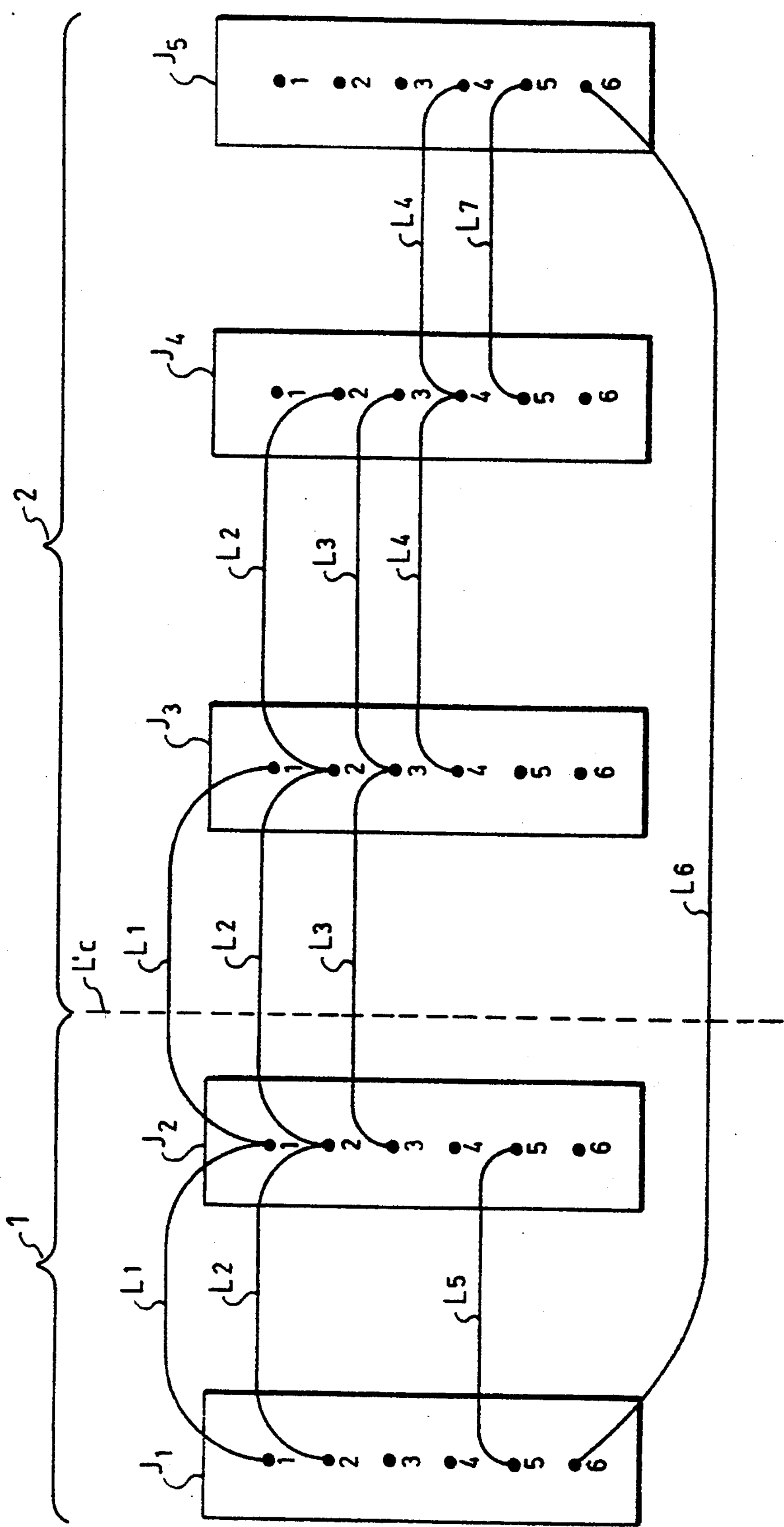

In FIG. 2, the cut-off line does not pass through testing points and simply separates the testing points by the intersecting of the equipotential lines as illustrated by a cut-off line L'c of FIG. 2 which intersect the first L1, second L2, third L3 and sixth L6 equipotential lines without encountering testing points.

Figure 3:
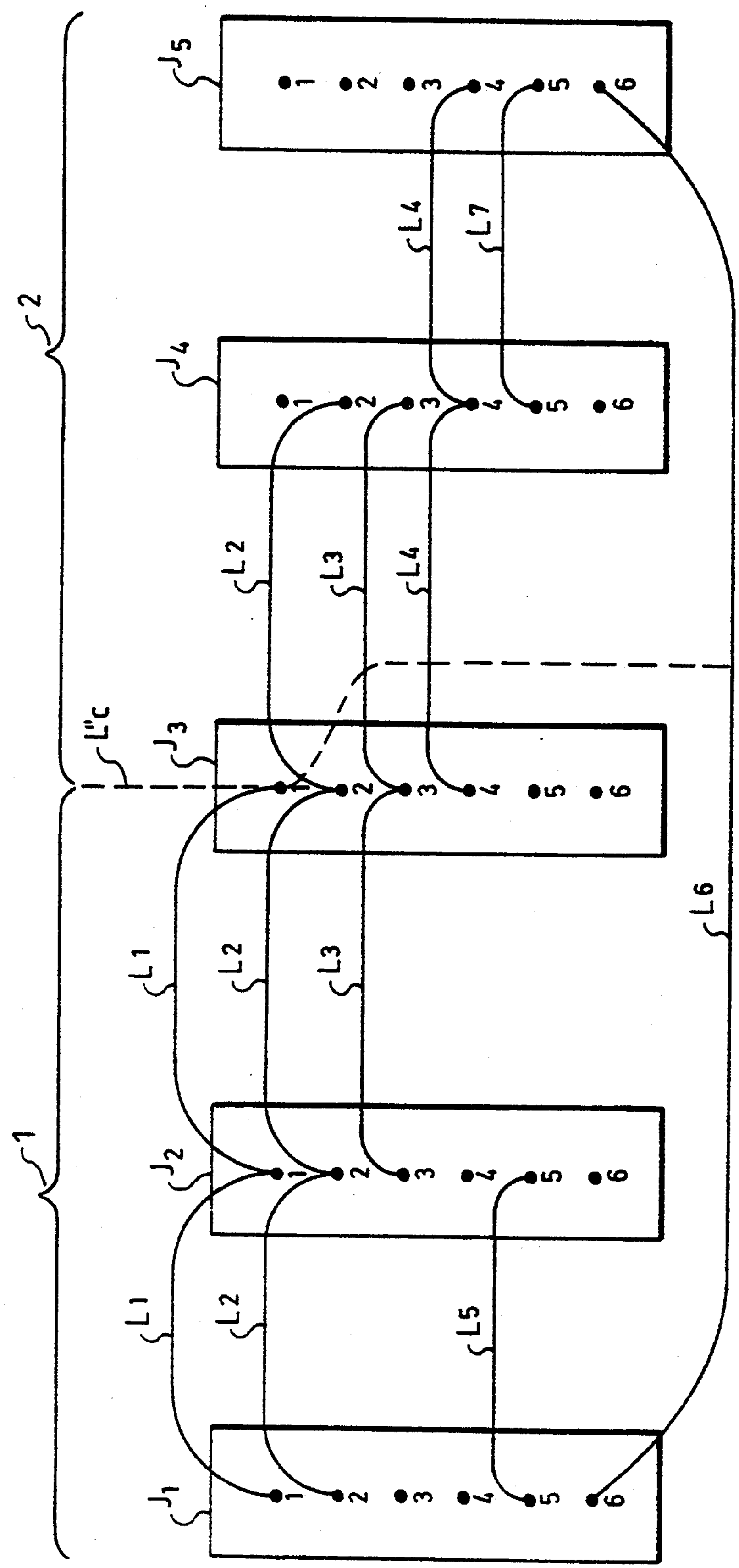

FIG. 3 shows another cut-off line L"c passing through a single testing point, the first terminal J3/1 of the third connector J3, and intersecting the second equipotential line L2, third equipotential line L3, fourth equipotential line L4 and sixth equipotential line L6.

Depending on the electrical test to be performed, whether the test is on the electrical continuity of the equipotential lines or on their insulation with respect to one another, different testing points of the first set E1 are added to the second set E2 while at the same time remaining in the first set E1, this set E1 remaining, for example, unchanged whatever may be the type of test to be carried out.

In a first step, the electrical test is, for example, carried out between the testing points of the first set E1. This test may be a test of electrical continuity between successive testing points of each of the equipotentials containing the testing points of the first set E1, the test being limited to the testing points of this set.

This test may also be a test on the insulation of the testing points belonging to different equipotential lines.

The first step could equally well be carried out on the second set E2. The electrical test could be done by every type of tester.

The cut-off line Lc, shown in FIG. 1, is for example positioned so that the first set E1 has a number of testing points close to the maximum capacity of the tester used, this number being at most equal to this maximum.

In a second step, the electrical test is carried out on the testing points of the remaining set E2 for example. Testing points of the first set E1 are also included in the second set E2, notably to ensure the continuity of the electrical test between the testing points of the first set E1 and the testing points of the second set E2.

Thus in the case, for example, of a testing of electrical continuity, if a link between a connector with an order number lower than that of the place of the cut-off line Lc and a connector with an order number higher than that of the cut-off line, such as for example the sixth equipotential line L6 between the first connector J1 and the fifth connector J5, all the terminals of the lower-order connector, the first connector J1 for example, belonging to equipotential lines connected to testing points of the second set E2, are added to this set. In the example of FIG. 1, first, second and sixth terminals J1/1, J1/2, J1/6 of the first connector J1 are added to the second set E2 for the first terminal J1/1 belongs to the first equipotential line L1 connected to the first terminal J3/1 of the third connector which belongs to the second set E2, the second terminal J1/2 belongs to the second equipotential line L2 which is connected to the second terminals J3/2, J4/2 of the third and fourth connectors J3, J4 which belong to the second set E2 and, finally, the sixth terminal J1/6 belongs to the sixth equipotential line L6 connected to the sixth terminal J5/6 of the fifth connector, which belongs to the second set. For the testing of electrical continuity, and again according to the exemplary embodiment of FIG. 1, the contents of the sets E1 and E2 are at least constituted by terminals or testing points:

J1/1, J1/2, J1/5, J1/6, J2/1, J2/2, J2/3, J2/5, J3/1, J3/2, J3/3, J3/4 for the first set E1;

J3/1, J3/2, J3/3, J3/4, J4/2, J4/3, J4/4, J4/5, J5/4, J5/5, J5/6, J1/1, J1/2, J1/6 for the second set E2.

For each set, the tests on electrical continuity are, for example, performed successively between testing points of one and the same equipotential line.

Generally therefore, the points on the first side 1 of the cut-off line which therefore belong to the first set E1, are also grouped with the points of the second set E2 if they are directly linked to a testing point of the second side, i.e. belong to the second set E2, a direct link implying that there is no testing point of the equipotential line between the two connected points.

Should the testing points belong to connectors, the electrical test may be carried out between connectors, for example, notably for greater ease of implementation of the tests, i.e. for a given connector, its points are tested successively with the points of the other connectors, these connectors being taken separately.

Thus in this case, as mentioned here above, if a terminal of a connector on the first side 1 of the cut-off line is directly connected by an equipotential line to a connector on the second side, then all the terminals of the connector of the first side connected by an equipotential line, whether directly or not, to a connector on the second side, are grouped with the points of the second set E2 while at the same time remaining in the first set E1 that groups together the testing points of the first side 1. A testing point that belongs to the cut-off line Lc belongs to both sides. Similarly, a connector whose cut-off line goes through its terminals belongs to both sides.

In the case of an insulation test between testing points or equipotential lines, the addition of points of the first set E1 to the second set E2 is carried out for example differently. In this case, when none of the testing points of an equipotential line belongs to the second side 2 or to the second set E2, the fifth line L5 for example in the case of FIG. 1, one of the testing points is added to this second set and is tested as a point not connected to an equipotential line, hence tested in isolation from the other points of the second set E2. In the example of FIG. 1, this added testing point is, for example, the fifth terminal J1/5 of the first connector belonging to the fifth equipotential line L5. This terminal J1/5 is tested as a point which is not connected to an equipotential line, hence tested in isolation from the other points of the second set E2, notably at the points J4/5 and J5/5 of the seventh equipotential line L7, which makes it possible to test the insulation of this line L7 with the fifth equipotential line L5. All the testing points of each set, which are not connected to equipotential lines, are for example tested in isolation from all the other testing points of the set to which it belongs.

The second set E2 may be constituted so as to ensure both a test of electrical continuity and a test of electrical insulation. However, in such a case, it has more points than if it had been designed solely for either one of these tests. The different configurations possible are therefore defined notably as a function of the capacities of the testing means.

Should each of the two sets E1 and E2 still possess, for example, an excessively great number of testing points, the sides 1, 2 associated with them may again be each cut by a cut-off line according to the method described here above, to generate two new sets, which may again be cut to generate two other new sets and so on and so forth, notably until the sets possess a number of testing points that are compatible with the available testing means.

What is claimed is:

1. A method for electrical testing of equipotential lines, each line containing at least two testing points, at least one cut-off line separating the testing points, the testing points of a first side of the cut-off line being grouped together in a first set, and the testing points of the other side being grouped together in a second set, the testing points of the cut-off line belonging to both sets, some of said equipotential lines having their test points entirely in one set, and others of said equipotential lines having their test points in both sets, the electrical testing being carried out, in a first step, between the testing points of the first set and, in a second step, between the testing points of the second set, a testing point of the first side that is connected directly by an equipotential line to a testing point of the second side is grouped with the points of the second set, while at the same time, remaining in the first set, to ensure the continuity of the electrical testing between the testing points of the first set and the testing points of the second set.

2. A method according to claim 1, wherein the electrical test is a test of electrical insulation between the testing points.

3. A method according to claim 1 wherein, with the testing points being connector terminals, if a terminal of a connector of the first side is directly connected by an equipotential line to a terminal of a connector of the other side, then all the terminals of this connector connected by an equipotential line to a connector of the second side are grouped in the second set while at the same time remaining in the first set, a connector whose cut-off line passes through its terminals belonging to both sides.

4. A method according to claim 1 wherein, with none of the points of an equipotential line belonging to the second set, one of the points of this equipotential line is added to the second set while remaining in the first set.

5. A method according to any claim 1 wherein, with the electrical test being performed by testing means capable of processing a maximum number of given testing points, the cut-off is placed so that the number of testing points of the first set is equal at most to the given maximum.

6. A method according to claim 1, wherein each of the two sides is intersected by a new cut-off line, a new cut-off line separating the testing points, the testing points of a first side being grouped together in a first new set and the testing points of the other side being grouped together in a second new set, an electrical test being performed between the testing points of each of the sets, the testing points of the cut-off line belonging to both sets, testing points of the first set being grouped in the second set to ensure the continuity of the electrical testing between the testing points of the two sets.

7. A method according to claim 1, wherein the electrical test is a test of electrical continuity between the testing points.

* * * * *